United States Patent
Richter et al.

(10) Patent No.: US 6,489,658 B2
(45) Date of Patent: Dec. 3, 2002

(54) MOS-TRANSISTOR FOR A PHOTO CELL

(75) Inventors: Harald Richter, Gärtringen (DE); Bernd Höfflinger, Sindelfingen (DE); Uwe Apel, Neckartailfingen (DE); Ulrich Seger, Magstadt (DE)

(73) Assignee: Institut fur Mikroelectronik (DE)

( * ) Notice: Subject to any disclaimer, the term of this patent is extended or adjusted under 35 U.S.C. 154(b) by 0 days.

(21) Appl. No.: 09/337,032

(22) Filed: Jun. 28, 1999

(65) Prior Publication Data

US 2002/0105038 A1 Aug. 8, 2002

(30) Foreign Application Priority Data

Jul. 6, 1998 (DE) .......................................... 198 30 179

(51) Int. Cl.[7] .............................................. H01L 29/76
(52) U.S. Cl. ........................ 257/401; 257/465; 257/466
(58) Field of Search ................................ 257/465, 466, 257/401

(56) References Cited

U.S. PATENT DOCUMENTS

| | | | | | |
|---|---|---|---|---|---|
| 5,285,091 A | * | 2/1994 | Hamasaki | .................... | 257/292 |
| 5,506,434 A | * | 4/1996 | Yonemoto et al. | .......... | 257/291 |
| 5,512,769 A | * | 4/1996 | Yamamoto | .................. | 257/339 |
| 5,561,077 A | * | 10/1996 | Terashima | .................. | 437/63 |
| 5,668,392 A | * | 9/1997 | Huang et al. | ................ | 257/340 |
| 5,712,497 A | * | 1/1998 | Watanabe et al. | ........... | 257/218 |
| 5,719,421 A | * | 2/1998 | Hutter et al. | ................ | 257/335 |
| 5,786,609 A | * | 7/1998 | Kemmer et al. | ............. | 257/257 |
| 5,869,352 A | * | 2/1999 | Maruyama et al. | ........... | 438/79 |
| 6,150,722 A | * | 11/2000 | Efland et al. | ................ | 257/762 |
| 6,166,769 A | * | 12/2000 | Yonemoto et al. | .......... | 348/308 |
| 6,278,154 B1 | * | 8/2001 | Abe | ........................... | 257/321 |

FOREIGN PATENT DOCUMENTS

| | | | | | |
|---|---|---|---|---|---|
| EP | | 487209 A1 | * | 5/1992 | .................. 257/461 |
| JP | | 357092877 | * | 6/1982 | .................. 257/465 |

* cited by examiner

*Primary Examiner*—Eddie Lee
*Assistant Examiner*—Eugene Lee
(74) *Attorney, Agent, or Firm*—St. Onge Steward Johnston & Reens LLC

(57) ABSTRACT

The invention relates to a MOS transistor for a photo cell, comprising a semiconductor substrate on which a gate electrode, a drain electrode and a photosensitive source region are configured. An oxide layer is arranged between the gate electrode and the substrate, and in the active region of the MOS transistor this oxide layer is formed as thin oxide film while it is configured as thick oxide film in a passive region. The inventive transistor is distinguished by the provisions that the gate electrode comprises a closed annular section in the active region of the MOS transistor, and that either the drain electrode or the photosensitive source region is arranged within the annular section of the gate electrode so that current will only flow in the active region.

7 Claims, 2 Drawing Sheets

MOS-TRANSISTOR FOR A PHOTO CELL

DESCRIPTION

The invention relates to a MOS transistor for a photo cell, comprising an active region and an isolating passive region joining the active region, wherein a photosensitive source zone, a drain electrode and a gate electrode are formed on the active region.

It is known from the German Patent 42 09 536 C2 to use such a MOS transistor in a photo cell for a pick-up chip. Such a pick-up chip comprises a plurality of photo cells arranged in two-dimensional arrays, which are each connected to a read-out logic for projection of a high input signal dynamic ratio to a reduced output signal dynamic ratio.

This photo cell is coupled to a read-out logic which is designed for projection of a high input signal dynamic ratio to a reduced output signal dynamic ratio so that a main electrode of a first photosensitive MOS transistor is connected to the gate of a second MOS transistor, that a control voltage is applied to the gate of the first MOS transistor, which serves to control the compression of the input signal dynamic ratio, that the other main electrode of the second MOS transistor is at a common potential, and that an output signal amplifier is connected to the second main electrode of the second MOS transistor.

When the drain electrode and the gate of the first transistor are shorted and connected to a fixed potential a precisely logarithmic output characteristic is achieved over a range of more than seven decades, which characteristic allows for a radiometrically unambiguous evaluation of the information in the picture.

For an improvement of the resolution of an array equipped with such photo cells it is necessary that the photo cell miniaturisation be continued. One method suitable for a further miniaturisation of the transistors of a photo cell is the so-called STI (shallow trench isolation) method wherein the active zones of the transistors are isolated by means of a trench filled with an oxide, with the electrode material for the gate electrode being disposed in strip form across the direction of current flow. The active zone (semiconductor material) is thus framed laterally by two isolating passive zones (oxide), with the gate electrode extending from a passive zone all over the active zone to the other passive zone (cf. Somnath Nag "Shallow trench isolation for sub-0.25 mm IC technologies" in: Solid State Technology, 1997, vol. 40, No. 9, pp. 129–135).

Even though this transistor, which is configured by means of the STI method, is fundamentally suitable for use as photosensitive element in the photo cell mentioned by way of introduction, such transistors produced with the STI technique present parasitic transistors at the interfacial regions between the active region and the isolating oxide regions. These parasitic transistors make themselves noticed at the characteristic in the low signal strength range, the so-called "subthreshold" range. This part of the characteristic should follow an exponential course if the gate and the drain electrode are connected to the same potential. Due to the parasitic transistors, however, another signal is superimposed on the characteristic having an inherent exponential course, which signal is partly essentially stronger than the signal proper and hence interferes with the exponential course. A transistor manufactured with the STI technique, which can be miniaturized, is therefore not suitable for the photo cell mentioned by way of introduction, on account of these parasitic transistors.

The invention is now based on the problem of providing a MOS transistor for a photo cell, which allows for a further miniaturisation of the photo cell and which is moreover suitable for generating an exponential characteristic of the photo cell.

This problem is solved by a MOS transistor having the features defined in Claim 1. Expedient improvements of the invention are defined in the dependent claims.

Due to the inventive configuration of the MOS transistor, which comprises an annular region following the gate electrode and where the drain electrode or the photosensitive source region, respectively, is disposed within the annular gate electrode, produces the effect that the current flows in a radial direction towards the centre or away from the centre of the annular region of the gate electrode. Thus a flow of current along the transition zone between the active and passive regions is not created so that any parasitic marginal effects are precluded.

The gate electrode comprises an appendix which crosses merely either the active source region or the drain electrode so that it does not take any influence on the characteristic of the inventive MOS transistor. The appendix rather permits the establishment of the electric contact of the gate electrode with an electric conductor above the passive region, as is necessary due to the manufacturing conditions.

With the inventive configuration of the MOS transistor eliminating any parasitic marginal effects, the STI method can be applied for producing it so that the passive isolating regions can be kept very narrow. The inventive MOS transistor is therefore better to miniaturise than comparable conventional transistors and permits the production of photosensitive arrays having a high resolution.

In a preferred embodiment the gate electrode and the drain electrode are connected to the same electrical potential so that the MOS transistor presents a logarithmic characteristic extending over several decades.

The invention will be described in the following by exemplary embodiments, without any restriction of the general inventive idea, with reference to the schematic drawing wherein.

Figure 4:
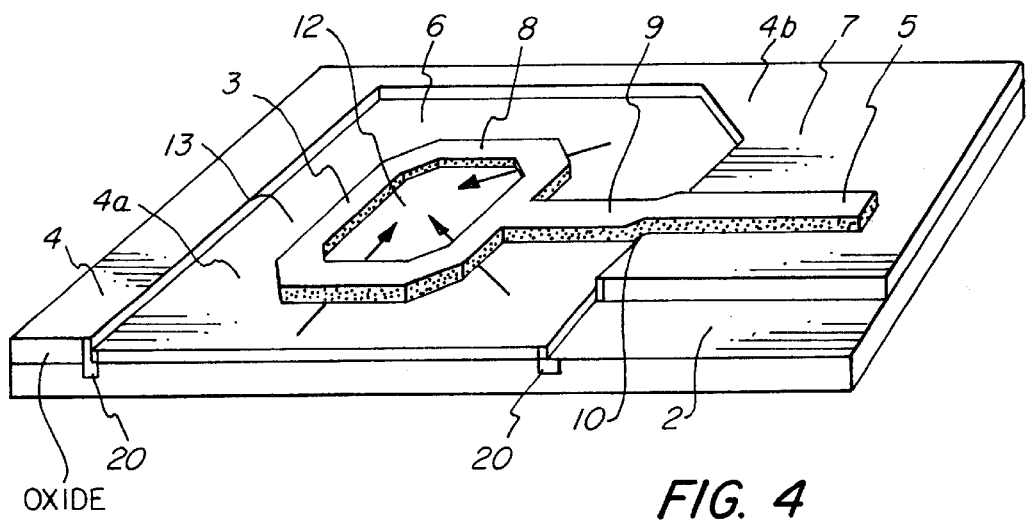
FIG. 4 is a simple perspective view of the inventive transistor for illustration of the flow of current.

The inventive MOS transistor 1 is configured on a semiconductor substrate 2 such as a silicon substrate (FIG. 4). A gate electrode 3 is formed on the semiconductor substrate 2, which, in a manner known per se, consists of an oxide layer 4 applied directly on the substrate 2, and of a polysilicon layer 5 deposited thereon. The oxide layer 4 has a thinner configuration in an active region or channel region 6 of the transistor, than in an adjacent passive region. In a manner known per se the doping in the semiconductor substrate 2 may also change at the junction from the active region 6 to the passive region 7.

In accordance with the invention the gate electrode 3 presents an annular section 8 which is disposed on the active region 6 of the transistor 1. An appendix 9 of the gate electrode 8 leads from the annular section 8 of the gate electrode 3 up to the passive region 7, which means that the oxide layer 4 between the polysilicon layer 5 and the semiconductor substrate 2 passes over from a thin oxide film 4a to a thick oxide film 4b in the transition zone 10 from the active region 6 to the passive region 7 which is disposed below the appendix 9. The plan view shows that the appendix, which is arranged in the passive region 7, is widened to form a square pad area on which an electrical conductor (not illustrated) can be contacted.

A drain electrode 12 is arranged within the annular sections 8 of the gate electrode 3.

A photosensitive source region 13, where charge carriers can be generated by irradiation of photons, is arranged outside the annular section 8 of the gate electrode 3. The charge carriers derive to the drain electrode 12 generate a photo current. The photo current is schematically illustrated in FIG. 4, with radial orientation of the flow of current to the drain electrode 12, which means that the photo current radiates from the source region 13, i.e. the zone beyond the ring 8 of the gate electrode 3, to the drain electrode 12 which is arranged in the centre of the annular section 8.

In the inventive arrangement of the electrodes 3, 12, 13 hence a photo current does not exist which flows along the transition zone 10. As there is no flow of current in the substrate 2 in the transition zone 10 parasitic transistors can actually not be created as is the case in conventional transistors manufactured in accordance with the STI method.

What is thus essential of the invention is the fact that the flow of current is restricted to the active region 6 and that a flow of current along the transition zone 10 is avoided. This effect is achieved by the annular section 8 of the gate electrode 3, which is arranged at a spacing from the transition zone 10.

It is also possible within the scope of the invention that the photosensitive source region may be arranged within the annular section 8 and that the drain electrode 12 is arranged outside the annular section 8. For a photo cell, however, the embodiment with the drain electrode 12 inside the annular section 8a of the gate electrode 3 is preferred, which is illustrated in FIG. 1, as it is possible with these provisions to detect a wide photosensitive source region 13 with a comparatively small electrode surface.

Within the scope of the invention it is also possible to vary the shape of the annular section 8 and adapt it to the general geometric conditions. For instance, the annular section may present a circular, square, rectangular, oval or similar configuration when seen in a plan view.

As described earlier, with the STI method the active zones of the transistors are isolated by means of a trench filled with an oxide, with the electrode material for the gate electrode being disposed in strip form across the direction of current flow. The active zone (semiconductor material) is thus framed laterally by two isolating passive zones (oxide), with the gate electrode extending from a passive zone all over the active zone to the other passive zone. The manufacture of the inventive MOS transistor 1 in accordance with the above described STI method includes a trench 20, and makes it possible that the thick oxide film 4b may present a very short or narrow shape, when seen in a plan view, so that the passive region 7 may be kept very narrow. A narrow passive region 7 permits a reduction of the total surface of the transistor 1, compared with conventional transistors, which allows for a further miniaturisation. Apart therefrom, a narrow passive region produces the effect that, compared with known transistors, the percentage of the active region 6, particularly the photosensitive source region 13, will be increased, which improves the photosensitivity of an individual transistor. The inventive MOS transistor hence enables the manufacture of a pick-up chip with a higher sensitivity, compared with conventional photo cells, because the percentage of the photosensitive area can be enlarged.

Figure 1:
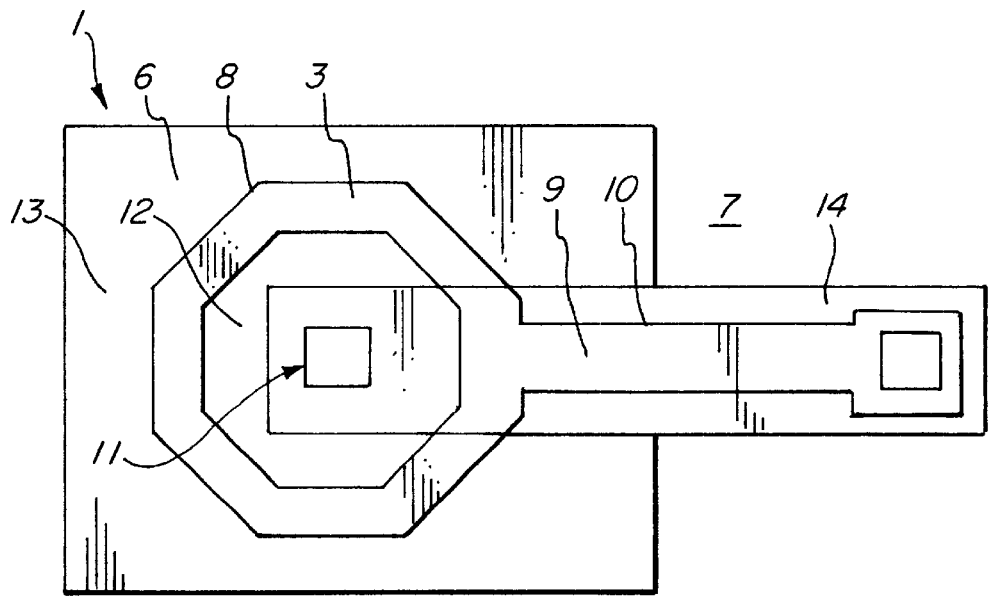
FIG. 1 is a plan view of an inventive MOS transistor.

The transistor illustrated in FIG. 1 comprises a thin metal film 14 which establishes the electrical connection between the gate electrode 3 and the drain electrode 12 and which is isolated from the substrate 2. With this provision the gate electrode 3 is shorted with the drain electrode 12, which furnishes a logarithmic current/voltage conversion (cf. graph 15 in FIG. 3). This graph 15 presents a precisely logarithmic course over a range extending beyond more than 7 decades.

Figure 2:
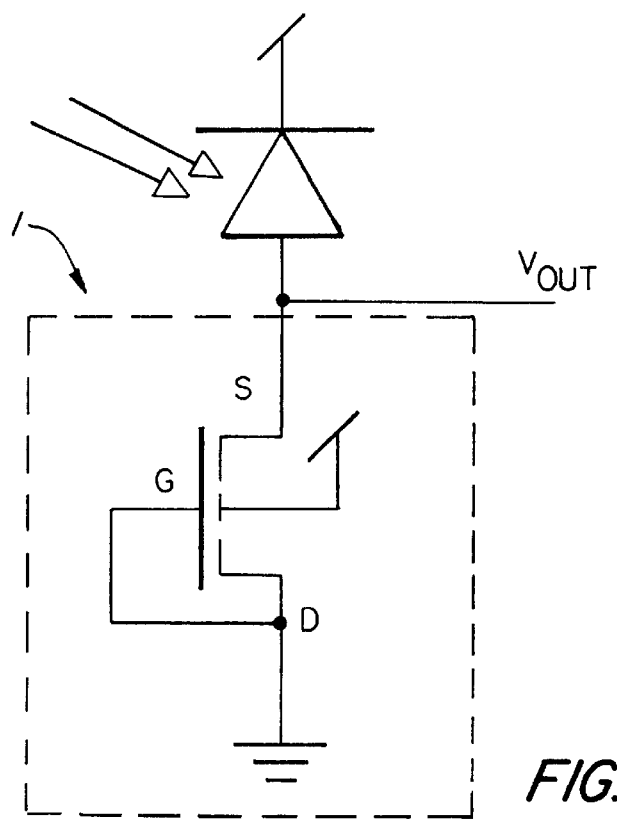
FIG. 2 shows an equivalent circuit diagram for the transistor according to FIG. 1.

The equivalent circuit diagram of the transistor 1 with the shorted drain and gate electrodes 12, 3 is illustrated in FIG. 2, with the gate and drain electrodes 3, 12 being connected to ground. For the output voltage $V_{OUT}$ the following relationship applies:

$$V_{OUT} \sim a + V_0 \log (I_d/I_0)$$

wherein a, $V_0$, $I_0$ are constants and $I_d$ represents the drain or photo current, respectively.

Figure 3:
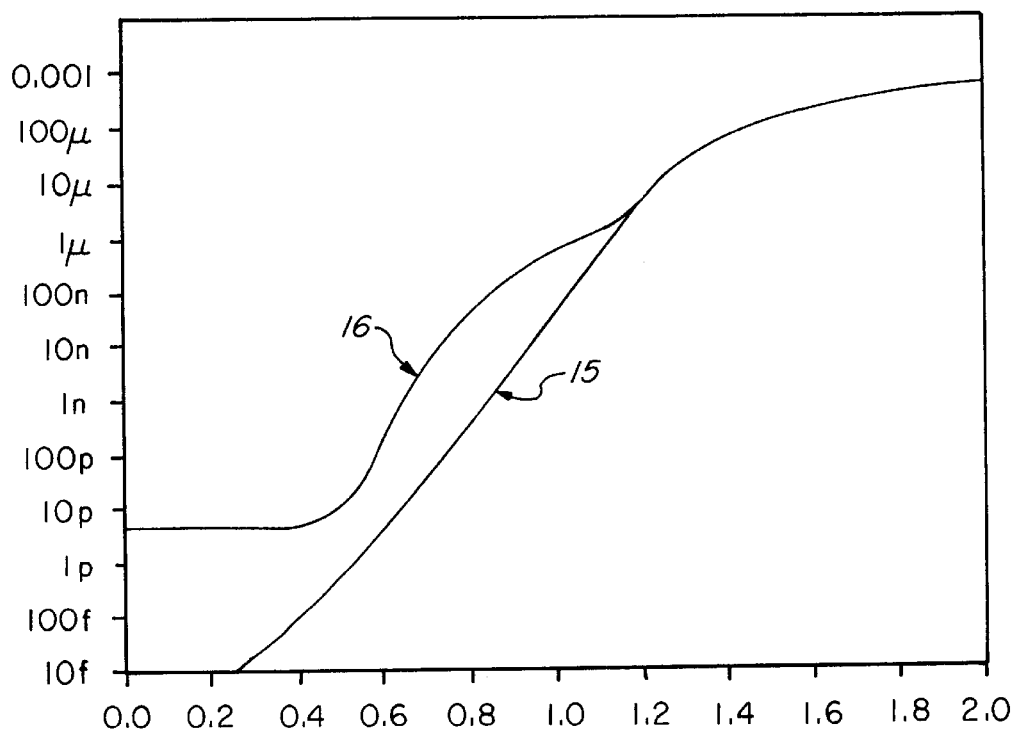
FIG. 3 is a diagram representing the characteristic of the transistor according to FIG. 1 and the characteristic of a conventional transistor produced in accordance with the STI method.

For comparison FIG. 3 illustrates the characteristic curve 16 of a transistor produced in accordance with the STI method and comprising a drain electrode shorted with the gate electrode. As a result of the parasitic transistors explained by way of introduction, its characteristic curve 16 presents a hunch in the section of $V_{out} < 1$ V, the sub-threshold section, compared against the characteristic 15 of the inventive transistor 1, which follows a straight course in the logarithmic diagram. This hunch is created by the additional parasitic transistors, which generate additional currents, which are superimposed with the current of the main transistor.

The inventive annular configuration of the gate electrode eliminates such parasitic currents in the transistors manufactured in accordance with the STI technique.

The inventive MOS transistor 1 is preferably employed as photosensitive element for a photo cell of a pick-up chip including an electronic analyser. Such an electronic analyzer may comprise an electronic read-out system which is designed for projecting a high input signal dynamic ratio to a reduced output signal dynamic ratio. In such a case the inventive MOS transistor with a main electrode is preferably connected to the gate electrode of a second MOS transistor so that a control voltage is applied to the gate electrode of the photosensitive transistor, which may be used to control a compression of the input signal dynamic ratio, whilst the other main electrode of the photosensitive transistor and the first main electrode of the second transistor are connected to a common potential, and that an output signal amplifier is connected to the second main electrode of the second transistor. This preferred circuit is disclosed in more details in the German Patent DE 42 09 536 C2 which is herewith referenced in terms of its complete contents.

LIST OF REFERENCES

1 MOS transistor
2 semiconductor substrate
3 gate electrode
4 oxide layer
4a thin oxide film
4b thick oxide film
5 polysilicon layer
6 active region
7 passive region 8 annular section
9 appendix
10 transition zone
11 pad area
12 drain electrode
13 source region
14 metal film
15 characteristic
16 characteristic

What is claimed is:

1. A MOS transistor for an image sensor comprising:

a semiconductor substrate;

an oxide layer formed on the semiconductor substrate, the oxide layer having a passive surface region and an active surface region, wherein the oxide layer is configured as a thin oxide film in the active surface region and a thick oxide film in the passive surface region, the thick oxide film framing the active surface region and being insulated by means of a trench extending below the substrate surface filled with an oxide;

a gate electrode separating a photosensitive source region and a drain electrode and being formed on the thin oxide film in the active surface region of the oxide layer, the gate electrode comprising a section of closed annular shape with a section extending from the thin oxide film in the active surface region to the think oxide film in the passive surface region where the gate electrode is electrically contacted;

the drain electrode being arranged within the section of closed annular shape and the photosensitive source region being arranged outside the section of closed annular shape; and the gate electrode and the drain electrode are connected to the same electrical potential.

2. The MOS transistor according to claim 1 the photosensitive source region is arranged within the section of closed annular shape and the drain electrode is formed outside the section of closed annular shape.

3. The MOS transistor according to claim 1, wherein the semiconductor substrate comprises silicon.

4. The MOS transistor according to claim 1, wherein the section of closed annular shape forms a circular shape.

5. The MOS transistor according to claim 1 wherein an electrical connection is provided between the gate electrode in the form of a thin metal film that is applied thereon and insulated from the substrate.

6. The MOS transistor according to claim 1, wherein the section of closed annular shape forms an oval shape.

7. The MOS transistor according to claim 1, wherein the section of closed annular shape forms an rectangular shape.

* * * * *